(12) United States Patent
Cleeves (10) Patent No.: US 7,453,755 B2
(45) Date of Patent: Nov. 18, 2008

(54) MEMORY CELL WITH HIGH-K ANTIFUSE FOR REVERSE BIAS PROGRAMMING

(75) Inventor: James M. Cleeves, Redwood City, CA (US)

(73) Assignee: Sandisk 3D LLC, Milpitas, CA (US)

( * ) Notice: Subject to any disclaimer, the term of this patent is extended or adjusted under 35 U.S.C. 154(b) by 48 days.

(21) Appl. No.: 11/174,240

(22) Filed: Jul. 1, 2005

(65) Prior Publication Data

US 2007/0002603 A1    Jan. 4, 2007

(51) Int. Cl.
    *G11C 17/18* (2006.01)
(52) U.S. Cl. .............. 365/225.7; 365/175; 365/115; 365/72
(58) Field of Classification Search .......... 365/225.7, 365/175, 115, 72
    See application file for complete search history.

(56) References Cited

U.S. PATENT DOCUMENTS

| | | | | | |
|---|---|---|---|---|---|
| 5,311,039 | A | * | 5/1994 | Kimura et al. ............ | 257/50 |
| 5,379,250 | A | * | 1/1995 | Harshfield ............... | 365/105 |
| 5,475,253 | A | | 12/1995 | Look et al. .............. | 257/530 |
| 5,486,707 | A | | 1/1996 | Look et al. .............. | 257/52 |
| 5,818,749 | A | * | 10/1998 | Harshfield ............... | 365/105 |
| 5,915,167 | A | | 6/1999 | Leedy .................... | 438/108 |
| 6,034,882 | A | | 3/2000 | Johnson et al. ........... | 365/103 |
| 6,100,120 | A | * | 8/2000 | Yu ........................ | 438/151 |
| 6,306,715 | B1 | * | 10/2001 | Chan et al. .............. | 438/301 |
| 6,342,414 | B1 | * | 1/2002 | Xiang et al. ............. | 438/201 |
| 6,351,406 | B1 | * | 2/2002 | Johnson et al. ........... | 365/103 |
| 6,369,421 | B1 | * | 4/2002 | Xiang et al. ............. | 257/321 |
| 6,376,787 | B1 | * | 4/2002 | Martin et al. ............ | 200/181 |
| 6,403,434 | B1 | * | 6/2002 | Yu ........................ | 438/300 |
| 6,420,215 | B1 | | 7/2002 | Knall et al. ............. | 438/131 |
| 6,451,641 | B1 | * | 9/2002 | Halliyal et al. .......... | 438/200 |
| 6,451,647 | B1 | * | 9/2002 | Yang et al. .............. | 438/240 |
| 6,455,424 | B1 | * | 9/2002 | McTeer et al. ........... | 438/675 |
| 6,456,524 | B1 | * | 9/2002 | Perner et al. ............ | 365/158 |
| 6,475,874 | B2 | * | 11/2002 | Xiang et al. ............. | 438/396 |
| 6,486,065 | B2 | * | 11/2002 | Vyvoda et al. ............ | 438/690 |
| 6,492,241 | B1 | * | 12/2002 | Rhodes et al. ............ | 438/386 |
| 6,495,437 | B1 | * | 12/2002 | Yu ........................ | 438/591 |
| 6,514,808 | B1 | * | 2/2003 | Samavedam et al. ........ | 438/197 |
| 6,515,888 | B2 | * | 2/2003 | Johnson et al. ........... | 365/130 |
| 6,525,953 | B1 | * | 2/2003 | Johnson .................. | 365/63 |
| 6,534,403 | B2 | * | 3/2003 | Cleeves .................. | 438/666 |
| 6,549,447 | B1 | * | 4/2003 | Fricke et al. ............ | 365/105 |
| 6,551,885 | B1 | * | 4/2003 | Yu ........................ | 438/300 |

(Continued)

OTHER PUBLICATIONS

Li et al., Evaluation of $SiO_2$ Antifuse in a 3D-OTP Memory, IEEE Transactions on Device and Materials Reliability, vol. 4, No. 3, Sep. 2004, pp. 416-421.

(Continued)

*Primary Examiner*—Viet Q Nguyen
(74) *Attorney, Agent, or Firm*—Dugan & Dugan, PC (57) ABSTRACT

An integrated circuit and associated method of programming are provided. Such integrated circuit includes a memory cell with a diode and an antifuse in communication with the diode. The antifuse is constructed to include a high-K dielectric material with a K greater than 3.9. Further, the memory cell is programmed utilizing a programming pulse that reverse biases the diode thereof.

34 Claims, 4 Drawing Sheets

U.S. PATENT DOCUMENTS

| | | | | |
|---|---|---|---|---|
| 6,552,409 | B2 * | 4/2003 | Taussig et al. | 257/529 |
| 6,559,014 | B1 * | 5/2003 | Jeon | 438/287 |
| 6,574,145 | B2 | 6/2003 | Kleveland et al. | 365/185.19 |
| 6,580,115 | B2 * | 6/2003 | Agarwal | 257/310 |
| 6,586,349 | B1 * | 7/2003 | Jeon et al. | 438/785 |
| 6,617,639 | B1 * | 9/2003 | Wang et al. | 257/324 |
| 6,661,691 | B2 * | 12/2003 | Fricke et al. | 365/63 |
| 6,686,646 | B2 * | 2/2004 | Lee | 257/530 |
| 6,690,597 | B1 * | 2/2004 | Perlov et al. | 365/94 |
| 6,704,235 | B2 * | 3/2004 | Knall et al. | 365/225.7 |
| 6,879,505 | B2 | 4/2005 | Scheuerlein | 365/51 |
| 6,906,361 | B2 * | 6/2005 | Zhang | 257/211 |
| 6,937,509 | B2 * | 8/2005 | Perner et al. | 365/171 |
| 7,012,297 | B2 * | 3/2006 | Bhattacharyya | 257/317 |
| 7,052,941 | B2 * | 5/2006 | Lee | 438/152 |
| 2002/0070754 | A1 | 6/2002 | Lambertson | 326/38 |
| 2003/0026158 | A1 | 2/2003 | Knall et al. | 365/225.7 |
| 2004/0002184 | A1 | 1/2004 | Cleeves | 438/201 |
| 2004/0016991 | A1 | 1/2004 | Johnson et al. | 257/530 |
| 2004/0108573 | A1 | 6/2004 | Herner | 257/530 |
| 2004/0245547 | A1 * | 12/2004 | Stipe | 257/200 |
| 2005/0014322 | A1 | 1/2005 | Herner et al. | 438/200 |
| 2005/0052915 | A1 | 3/2005 | Herner et al. | 365/202 |
| 2005/0098800 | A1 | 5/2005 | Herner et al. | 257/209 |
| 2005/0121742 | A1 | 6/2005 | Petti et al. | 257/530 |
| 2006/0249753 | A1 * | 11/2006 | Herner et al. | 257/202 |

OTHER PUBLICATIONS

Herner et al., "Verticle p-i-n Polysilicon Diode With Antifuse for Stackable Field-Programmable ROM," IEEE Electon Device Letters, vol. 25, No. 5, May 2004.

Herner et al., "Polycrystalline silicon/$CoSi_2$ Schottky diode with integrated $SiO_2$ antifuse: a nonvolatile memory cell," Applied Physics Letters, vol. 82, No. 23, 2004.

McPherson et al., "Proposed Universal Relationship Between Dielectric Breakdown and Dielectric Constant," IEEE International Electron Devices Meeting, 2002, pp. 26.6.1-4.

McPherson et al., "Trends in the Ultimate Breakdown Strength of High Dielectric-Constant Materials", IEEE Transactions on Electron Devices, vol. 50., No. 8, (Aug. 2003), 1771-1778.

* cited by examiner

MEMORY CELL WITH HIGH-K ANTIFUSE FOR REVERSE BIAS PROGRAMMING

RELATED APPLICATIONS

The present application is related to a first co-pending application filed coincidently herewith under naming N. Johan Knall as sole inventor, and entitled "REVERSE-BIAS METHOD FOR WRITING MEMORY CELLS IN A MEMORY ARRAY," and a second co-pending application filed coincidently herewith under naming inventor Xiaoyu Yang et al., and entitled "MEMORY WITH HIGH DIELECTRIC CONSTANT ANTIFUSES AND METHOD FOR USING AT LOW VOLTAGE," which are each incorporated herein by reference in their entirety for all purposes.

BACKGROUND AND FIELD OF THE INVENTION

The present invention relates to memory devices, and more particularly to memory cells equipped with antifuses.

SUMMARY

An integrated circuit and associated method of programming are provided. Such integrated circuit includes a memory cell with a diode and an antifuse in communication with the diode. The antifuse is constructed to include a high-K dielectric material with a K greater than 3.9. Further, the memory cell is programmed utilizing a programming pulse that reverse biases the diode thereof.

DETAILED DESCRIPTION

Figure 1:
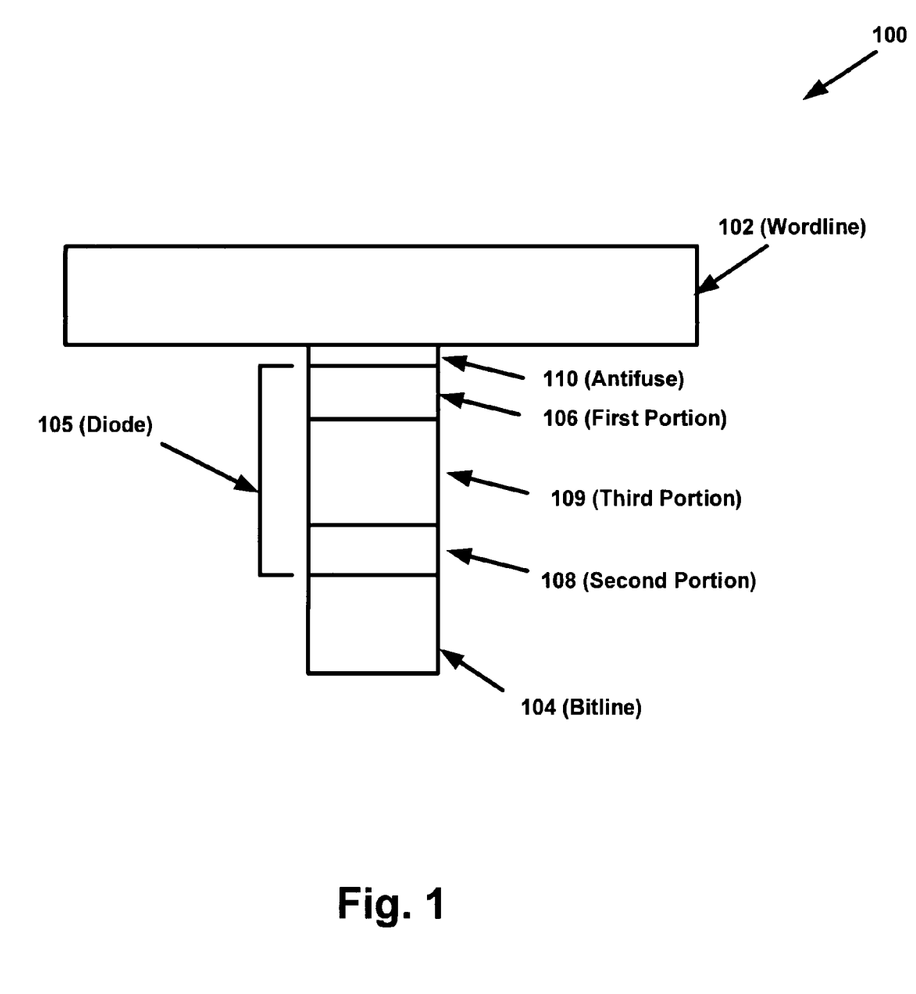
FIG. 1 is a cross-sectional view showing a portion of an integrated circuit including a memory cell, according to one embodiment.

FIG. 1 is a cross-sectional view showing a portion of an integrated circuit including a memory cell 100, according to one embodiment. While only a portion of such integrated circuit is shown, it should be understood that a multiplicity of memory cells 100 may be interconnected in an array that may span in two directions. Further, while only one memory cell 100 will initially be described in the context of only one level of the memory cells 100, it should further be noted that, in some optional embodiments, a plurality of levels of the memory cells 100 may be vertically disposed to form a three-dimensional array of memory cells 100. More information regarding such a three-dimensional array embodiment will be set forth hereinafter in greater detail during reference to FIG. 4.

As shown in FIG. 1, the memory cell 100 is equipped with a diode 105 and an antifuse 110 in communication with the diode 105. The diode 105 and antifuse 110 are positioned between a word line 102 and a bit line 104. In one embodiment, the antifuse 110 may be a dielectric layer between diode portions such that the diode 105 is formed after the antifuse 110 is ruptured. More information regarding possible antifuse constructions and related operation will be set forth hereinafter in greater detail. As an option, the word line 102 and bit line 104 may take the form of rails for interconnecting a plurality of the memory cells 100.

Generally, the diode 105 may include a first portion 106 having a first heavily doped semiconductor material with a first conductivity type (e.g. P-type, N-type) and at least one other portion having an intrinsic semiconductor material or a doped semiconductor material with a second conductivity type (e.g. N-type, P-type) opposite the first conductivity type. In various embodiments, the antifuse 110 may be in contact with the first portion 106 of the diode 105 (as shown), and/or in contact with the at least one other portion of the diode 105.

With respect to the at least one other portion of the diode 105 shown in FIG. 1, a second portion 108 of the diode 105 may be provided with a heavily doped semiconductor material having the second conductivity type. Further, the diode 105 may also include a third portion 109 including an intrinsic or a lightly doped semiconductor material. While any material may be utilized for construction of the diode 105, the diode 105 may, in one embodiment, be constructed utilizing a polycrystalline semiconductor material, such as polycrystalline silicon. Of course, any material capable of providing the diode 105 may be utilized.

As further shown, the first portion 106 of the diode 105 may be disposed vertically above the second portion 108 of the diode 105. Also, the third portion 109 of the diode 105 may be disposed vertically between the first portion 106 of the diode 105 and the second portion 108 of the diode 105. Whereas one configuration is shown in FIG. 1, it should be noted that the various portions of the diode 105 may be constructed as a rail, pillars, and/or any other desired configuration.

For example, more information regarding an exemplary pillar structure and optional fabrication methods may be found with reference to U.S. Pat. No. 6,034,882, issued Mar. 7, 2000, which is incorporated herein by reference in its entirety for all purposes. Further, more information regarding a possible rail structure may be found with reference to U.S. Pat. No. 6,420,215, issued Jul. 16, 2002, which is incorporated herein by reference in its entirety for all purposes. Another possible pillar structure and further fabrication methods may be found with reference to U.S. patent application Ser. No. 10/855,775, filed May 26, 2004, which is also incorporated herein by reference in its entirety for all purposes.

While the antifuse 110 is depicted to be vertically disposed above the first portion 106 of the diode 105, the antifuse 110 may, in various embodiments, be disposed vertically below the second portion 108 of the diode 105, and/or vertically between the first portion 106 of the diode 105 and the second portion 108 of the diode 105. For example, the antifuse 110 may be disposed vertically between the second portion 108 of the diode 105 and the third portion 109 of the diode 105, and/or between the first portion 106 of the diode 105 and the third portion 109 of the diode 105. In one embodiment, the antifuse 110 may be disposed between a plus concentration of one conductivity type and a minus concentration of another conductivity type (e.g. between P+ and N− conductivity types or between N+ and P− conductivity types).

In use, each memory cell 100 is disposed between the word line 102 and bit line 104 in such a manner that an individual memory cell 100 may be programmed by applying a programming voltage between an associated word line 102 and bit line 104. Further, the antifuse 110 may provide a barrier to voltage-induced current when the memory cell 100 is in an un-programmed state. When a sufficient programming voltage is applied to the memory cell 100, the antifuse 110 experiences dielectric breakdown, and a permanent conductive path through the antifuse 110 is formed. Thereafter, the diode 105 is free to serve as a one-way valve, allowing current flow in one direction only.

During the aforementioned programming, the memory cell 100 is subjected to a programming pulse that reverse biases the diode 105 thereof. More information regarding such reverse bias programming is set forth in greater detail hereinafter as well as in a co-pending application filed coincidently herewith under naming N. Johan Knall as sole inventor, and entitled "REVERSE-BIAS METHOD FOR WRITING MEMORY CELLS IN A MEMORY ARRAY," hereinafter referred to as "Co-Pending Application," which was previously incorporated.

For reasons that will soon become apparent, the antifuse 110 includes a high-K dielectric material with a K greater than 3.9. It should be noted that any high-K dielectric material may be employed in the construction of the antifuse 110. Just by way of example, the high-K dielectric material may be titanium oxide, tantalum oxide, hafnium oxide, and/or aluminum oxide. Such list is not exhaustive and should not be construed as limiting in any manner, as any high-K dielectric material with a K greater than 3.9 may be employed. For example, additional examples of high-K dielectric material may be found with reference to McPherson et al., "Proposed Universal Relationship Between Dielectric Breakdown and Dielectric Constant," IEEE International Electron Devices Meeting, 2002, pp. 26.6.1-4, which is incorporated herein by reference in its entirety for all purposes.

By utilizing such reverse bias programming with a high-K dielectric antifuse 110, various optional beneficial features may be afforded, which will be set forth in greater detail hereinafter. It should be noted, however, that the following beneficial features are set forth for illustrative purposes only and should not be construed as limiting in any manner. Of course, embodiments are envisioned wherein such features are not existent.

It is conceived that memory cells may be programmed utilizing reverse bias programming techniques and lower-K dielectric antifuses, such as silicon dioxide. Unlike forward biasing programming techniques, the aforementioned reverse biasing requires a higher bias voltage. In particular, as will become more apparent during for reverse biasing with respect to forward biasing. To this end, the lower-K dielectric antifuse requires a greater negative voltage to provide the current necessary to rupture the same. Such negative voltage is so high that full reverse breakdown of the diode may occur during the programming. Such breakdown is a condition where the amount of current through the diode rises dramatically as a function of voltage (this is undesirable for numerous reasons including power consumption). Thus, the elevated reverse bias voltage, when used in combination with lower-K dielectric antifuses, has a potential of heating up and/or damaging the associated diode when the antifuse ruptures, as well as consuming large quantities of power.

By utilizing an antifuse including a high-K dielectric material with a K greater than 3.9 in the context of the memory cell of FIG. 1, a lower programming voltage is required. In particular, the high-K dielectric antifuse exhibits a lower current density at the point of rupture, with respect to lower-K dielectric counterparts. To this end, the antifuse is ruptured in reverse at a voltage below the reverse breakdown voltage of the diode. By this feature, not only is there a possible reduction in any damage potential, but there is also an optional reduction in the required current and power.

While the high-K dielectric antifuse may provide the foregoing benefits, it may also exhibit additional undesired leakage during read operations. This leakage may optionally be addressed by thickening the high-K dielectric antifuse to the point that the voltage at which rupture occurs is similar to lower-K dielectric counterparts. By this design, leakage may be less than that exhibited by lower-K dielectric antifuses and the same voltages can be used by associated drivers and sense amplifiers. Of course, when the thicker high-K dielectric antifuse does rupture, the current density is much less than that of lower-K dielectric antifuses, thus providing the foregoing benefits. It should be noted that with a higher K, a greater margin is provided from reverse breakdown of the diode, as will become more apparent during reference to FIG. 3.

Such embodiment further facilitates lower-power, multiple bit/level programming, which will be set forth hereinafter in greater detail. Different diode structures may be employed. For example, P+N diode configurations (i.e. first portion 106 including a P+ conductivity type, and second portion 108 including an N conductivity type) have been utilized in reverse bias programming frameworks like that set forth in the Co-Pending Application. In the context of another embodiment, additional diode structures such as N+P (i.e. first portion 106 including an N+ conductivity type, and second portion 108 including a P conductivity type) may further be employed.

More illustrative information regarding the foregoing optional benefits, various optional architectural features, and/or programming techniques will be set forth hereinafter in greater detail during reference to subsequent figures. It should be noted that the following information is set forth for illustrative purposes and should not be construed as limiting in any manner. Any of the following features may be optionally incorporated with or without the exclusion of other features described.

Figure 2:
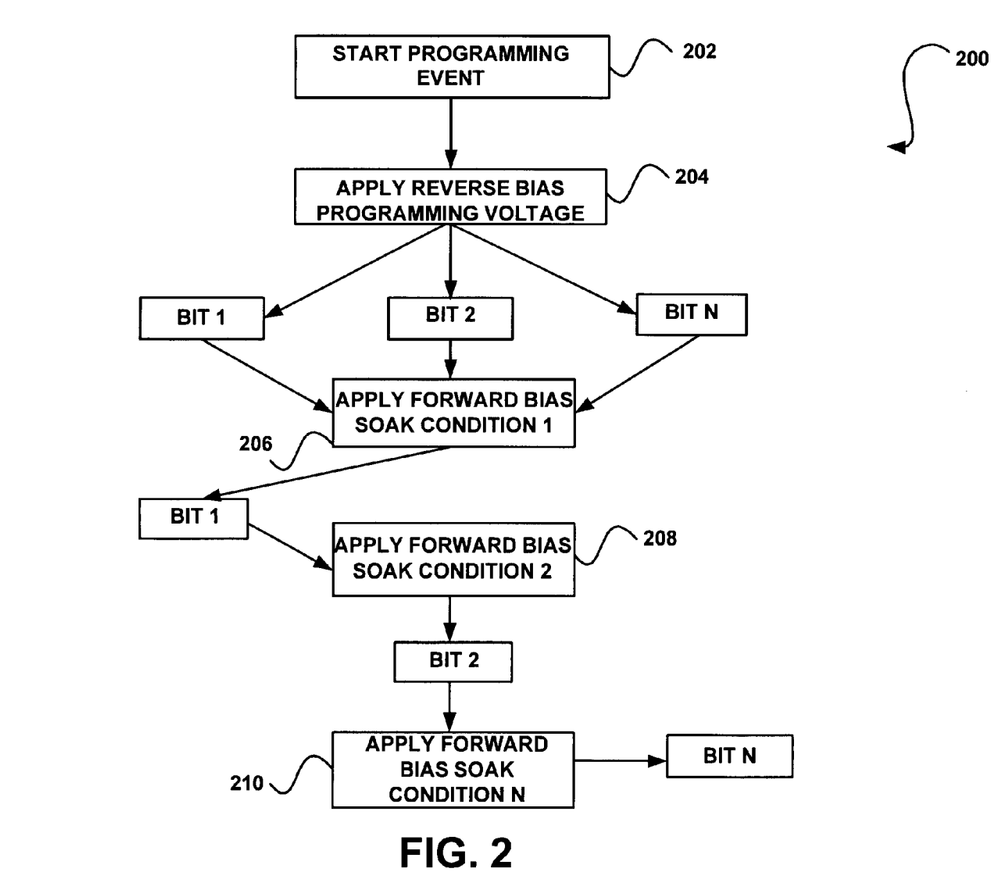
FIG. 2 illustrates a method for programming an array of memory cells, in accordance with another embodiment.

FIG. 2 illustrates a method 200 for programming an array of memory cells, in accordance with another embodiment. As an option, the method 200 may be utilized to program memory cells similar to the memory cell 100 of FIG. 1. Of course, however, the method 200 may be carried out to program any desired memory cell(s). Further, while various operations are set forth in the context of the present method 200, various operations may be omitted, and/or additional unillustrated operations may, of course, be employed as desired.

Initially, in operation 202, a programming event is started for programming at least one memory cell (e.g. memory cell 100 of FIG. 1) including a diode and an antifuse in communication with the diode. In response to such start event in operation 202, a programming voltage is applied to at least one memory cell for reverse biasing the diode of the memory cell.

As shown, the programming voltage may be applied to a plurality of memory cells simultaneously. Note bit 1, bit 2, and bit N of FIG. 2. Of course, other embodiments are contemplated where a single memory cell is programmed at a time. By programming the memory cells simultaneously, the number of memory cells that are programmed over time may be increased. As mentioned previously, such simultaneous memory cell programming may be facilitated by virtue of the fact that the high-K dielectric antifuse may possibly require less current.

Again, this is accomplished by the reduced current required for rupturing of the antifuse, as well as the reduced leakage provided by the thickening of the high-K dielectric antifuse. By reducing the current required for antifuse rupture, the voltage drop down the lines to the diode is smaller. To this end, most of the voltage is dropped across the diode and not in the lines, which enables sufficient power for simultaneous memory cell programming. In one embodiment, the aforementioned programming pulse may be slightly longer temporally, but on a whole, far more memory cells may be programmed, such that a pulse length may rise by a factor of 2-10× (for example), but the number of memory cells to be programmed may rise by a factor of 10 to 10,000 (for example).

As an option, in operation 206, a first soaking pulse may be applied to a first memory cell (e.g. bit 1) under a first soak condition, which forward biases the diode of the memory cell. Similarly, in operation 208, a second soaking pulse may be applied to a second memory cell (e.g. bit 2) under a second soak condition, which also forward biases the diode of such memory cell. As indicated in operation 210, additional soaking pulses may be applied to additional memory cells (e.g. bit N), for reasons that will soon become apparent.

It should be noted that the soaking pulse is an option and may be applied to the appropriate memory cells one at a time in the foregoing manner, such that multiple levels are set for each bit. Of course, if there is only an "on" and "off" state, such soak pulse may not be necessary. Further, if the required current flow is high enough when forward biasing the diode, a reduced number of bits may be simultaneously programmed, due to power limitations.

Thus, as reflected in FIG. 2, different soaking pulses may be applied to the memory cells, which results in the diode of each memory cell being capable of exhibiting one of a plurality of different resistances when turned on. Specifically, after the antifuse is ruptured, the diode may be equipped with a lower resistance by forcing a larger current therethrough using the soaking pulse. This phenomenon results from a filament formed through the antifuse becoming larger as it is heated with additional current. Thus, in one hypothetical multilevel programming example, a "0" state may exhibit 10 megaOhms across the cell, a "1" state may exhibit 1000 ohms, a "2" state may exhibit 500 ohms, and a "3" state may exhibit 100 ohms. Of course, these resistance levels are merely illustrative in nature and should not be construed as limiting in any manner.

To this end, the on current of each memory cell may be set by soaking at a high forward bias. Further, the level of the on bit may be set by choosing a soak condition that gives a different on condition for one memory cell with respect to another. For example, a first memory cell may be set, or programmed, by a forward voltage of 3V and may pass 500 nA at 2V (due to the presence of a first resistance). Further, a second memory cell may be set with a 5V forward bias, which may result in the second memory cell passing more than 1 uA at 2V (due to the presence of a second resistance).

Figure 3:
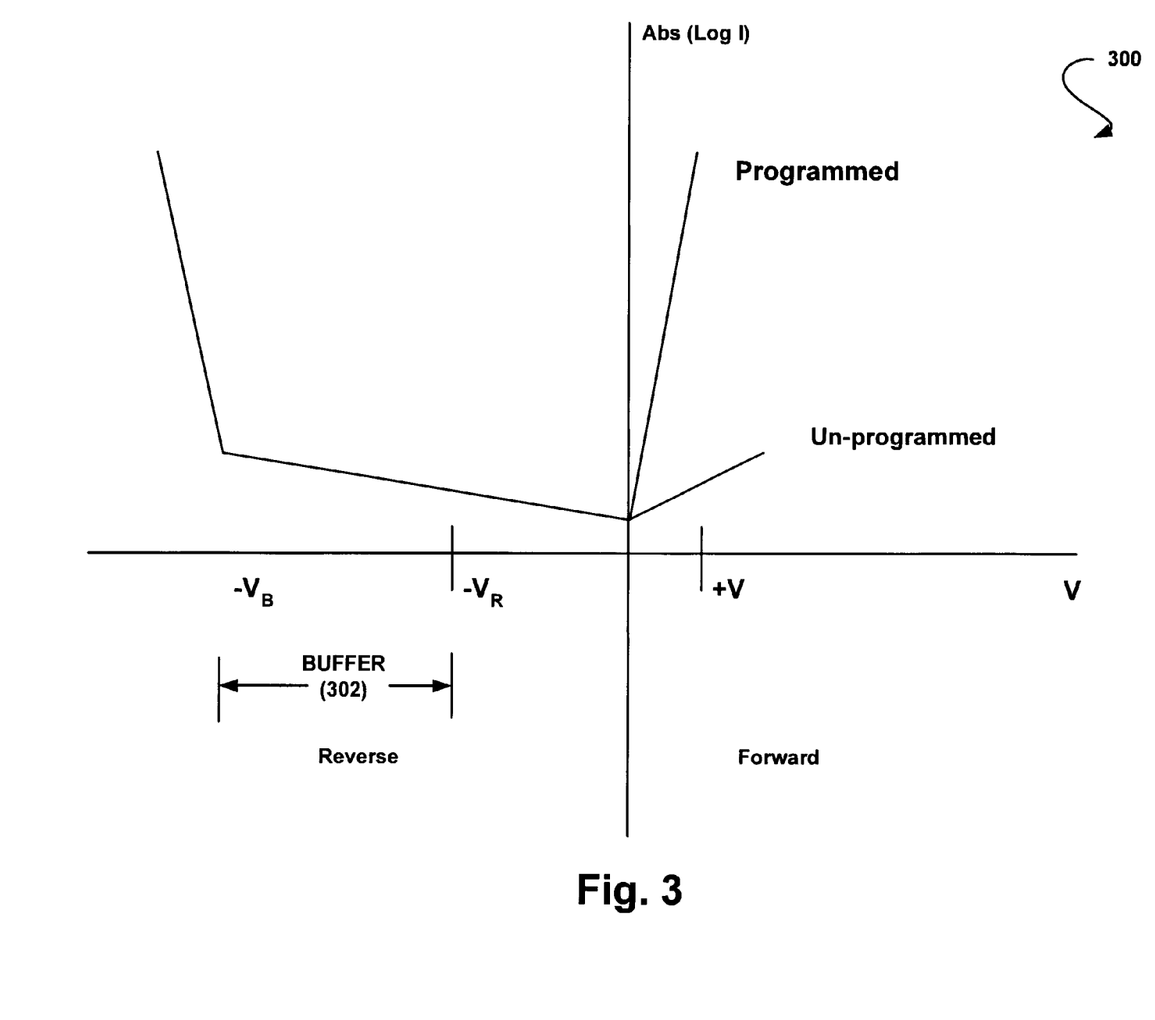
FIG. 3 is a graph showing a current vs. voltage relationship for a diode, in accordance with another embodiment.

FIG. 3 is a graph 300 showing a current vs. voltage relationship for a diode, in accordance with another embodiment. As an option, the current vs. voltage relationship shown in the graph 300 may reflect the operation of the memory cell 100 of FIG. 1. As shown, an additional buffer 302, or margin, is provided between voltage—$V_R$ at which the antifuse ruptures, and the voltage—$V_B$ where the diode is damaged due to reverse bias breakdown. To this end, damage to the diode is avoided during programming, while affording the various optional benefits discussed previously. After a particular memory cell is programmed, the current vs. voltage relationship of the programmed memory cell differs from that of an un-programmed memory cell, as shown.

Thus, in use, both a dielectric strength and a current density at rupture are decreased as a function of an increase in the dielectric constant of the antifuse. The diode and antifuse act like two series resistors before and after programming. If the diode is forward biased, it exhibits a low resistance such that most of the voltage is dropped across the antifuse. In reverse bias, the diode has a high resistance. In order for a programming field to be formed across the antifuse when reverse biasing, the antifuse should exhibit a higher resistance with respect to the reverse-biased diode. This condition needs to exist while the reverse bias level is still well below the reverse bias breakdown voltage (see buffer 302). This may be necessary to prevent the diode from actually breaking down in reverse, which may result in damage to the diode.

Figure 4:
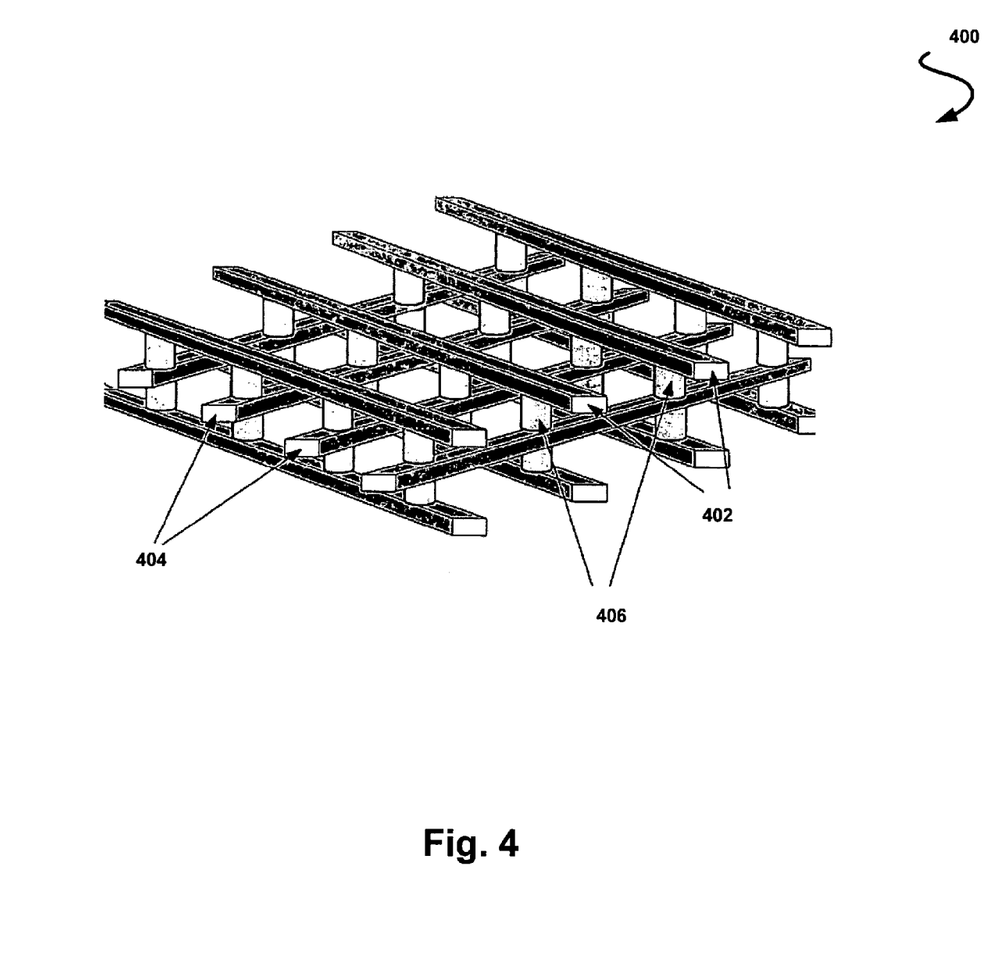
FIG. 4 shows a three-dimensional array of memory cells, in accordance with another embodiment.

FIG. 4 shows a three-dimensional array 400 of memory cells, in accordance with another embodiment. As shown, the memory cell array 400 may include more than one level of the word lines 402 and/or more than one level of the bit lines 404 with memory cells 406 (e.g. diode 105 and antifuse 110 of the memory cell 100 of FIG. 1) formed therebetween. In the context of the present description, a "level" of the three-dimensional array embodiment includes a plurality of word lines 402, a plurality of bit lines 404, and/or a plurality of memory cells 406 substantially positioned in a common approximate plane.

Further, as an option, the level(s) of bit lines 404 and/or level(s) of word lines 402 may be monolithically formed above a substrate in the form of a monolithic three dimensional memory array. While the substrate may be formed of any desired material, the substrate may, in one embodiment, include monocrystalline silicon.

A monolithic three-dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three-dimensional memory arrays.

In yet another optional embodiment, a substrate on which the memory cells are constructed may include supporting circuitry already formed in a single crystal wafer, where the substrate is capped by a planarized silicon dioxide layer. Optionally, there may be openings formed in this oxide layer to accommodate the formation of electrical connections between a memory level(s) and the aforementioned circuitry therebelow. A layer of tungsten (W) may be formed over the wafer with or without an underlying adhesion-promoting layer such as Ti/TiN.

Next, a barrier metal layer such as TiN may be deposited to prevent formation of WSi during the subsequent deposition of first an N+ doped silicon layer and then, in the same operation, a layer of N− silicon. This stack of layers may then be patterned into rails using a photoresist mask and plasma-assisted dry etching. Once the wafers are cleaned after patterning, a silicon dioxide layer may be deposited such that it fills the gaps between the rails. This oxide layer may then be chemical-mechanically polished to expose the silicon at the top of the rail. The wafer is thereafter implanted with p-type dopant to form a thin layer in the top of the N− silicon. An antifuse is then either deposited or grown on this surface.

Subsequently, TiN, W and TiN are sequentially deposited. Next, P+ and P− material or undoped Si is deposited. A similar masking and etching operation is performed with the primary direction of the new rail being orthogonal to the first.

One difference in the second patterning step is that the etch may need to continue past the layers of the second stack. The P+ material implanted into the lower stack may further need to be removed between the rails of the second stack to prevent them from being shorted together. Once such P+ material is removed, the N− material can be left intact or partially etched. These operations result in a word line and a bit line formed with a diode/antifuse combination built between them. It is expected that this process may be repeated several times to build a three-dimensional structure.

The foregoing description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. An integrated circuit, comprising:
    a memory cell including:
        a diode, and
        an antifuse in communication with the diode and disposed vertically above or below the diode;
    wherein the antifuse includes a high-K dielectric material with a K greater than 3.9;
    wherein the memory cell is programmed utilizing a programming pulse that reverse biases the diode thereof.

2. The integrated circuit of claim 1, wherein the diode includes a first portion including a first heavily doped semiconductor material having a first conductivity type and a second portion including an intrinsic semiconductor material or a doped semiconductor material having a second conductivity type opposite the first conductivity type.

3. The integrated circuit of claim 2, wherein the antifuse is in contact with the first portion of the diode.

4. The integrated circuit of claim 2, wherein the antifuse is in contact with the second portion of the diode.

5. The integrated circuit of claim 2, wherein the first portion of the diode is disposed vertically above the second portion of the diode.

6. The integrated circuit of claim 5, wherein the antifuse is disposed vertically below the second portion of the diode.

7. The integrated circuit of claim 5, wherein the antifuse is disposed vertically above the first portion of the diode and the second portion of the diode, wherein the second portion includes a doped semiconductor material having a second conductivity type opposite the first conductivity type.

8. The integrated circuit of claim 5, wherein the antifuse is disposed vertically above the first portion of the diode.

9. The integrated circuit of claim 2, wherein the second portion of the diode includes a heavily doped semiconductor material having the second conductivity type, and wherein the diode further includes a third portion, the third portion of the diode including an intrinsic or a lightly doped semiconductor material, the third portion of the diode disposed vertically between the first portion of the diode and the second portion of the diode.

10. The integrated circuit of claim 9, wherein the antifuse is disposed vertically below the second portion of the diode and the third portion of the diode.

11. The integrated circuit of claim 9, wherein the antifuse is disposed vertically above the first portion of the diode and the third portion of the diode.

12. The integrated circuit of claim 1, wherein the high-K dielectric material is titanium oxide.

13. The integrated circuit of claim 1, wherein the high-K dielectric material is tantalum oxide.

14. The integrated circuit of claim 1, wherein the high-K dielectric material is hafnium oxide.

15. The integrated circuit of claim 1, wherein the high-K dielectric material is aluminum oxide.

16. The integrated circuit of claim 1, wherein the memory cell is included in an array of memory cells including a plurality of word lines and a plurality of bit lines.

17. The integrated circuit of claim 16, wherein the array of memory cells comprises more than one level of the word lines or more than one level of the bit lines.

18. The integrated circuit of claim 17, wherein the more than one level of bit lines or more than one level of word lines are monolithically formed above a substrate in a monolithic three dimensional memory array.

19. The integrated circuit of claim 18, wherein the substrate comprises monocrystalline silicon.

20. The integrated circuit of claim 1, wherein the diode comprises a polycrystalline semiconductor material.

21. The integrated circuit of claim 20, wherein the diode comprises polycrystalline silicon.

22. A method for programming memory, comprising:
    applying a programming pulse to a memory cell including a diode and an antifuse in communication with the diode and disposed vertically above or below the diode;
    wherein the antifuse includes a high-K dielectric material with a K greater than 3.9;
    wherein the programming pulse reverse biases the diode of the memory cell.

23. The method of claim 22, wherein the memory cell is programmed in one of a plurality of available memory states.

24. A method for programming memory, comprising:
    applying a programming pulse to a memory cell including a diode and an antifuse in communication with the diode;
    wherein the antifuse includes a high-K dielectric material with a K greater than 3.9;
    wherein the programming pulse reverse biases the diode of the memory cell;
    wherein the memory cell is programmed in one of a plurality of available memory states;
    wherein the memory cell is programmed in more than one memory state by applying different soaking pulses to the memory cell which forward bias the diode of the memory cell.

25. The method of claim 24, wherein the application of the different soaking pulses result in the diode of the memory cell including different resistances when turned on.

26. A method for programming memory, comprising:
    applying a programming pulse to a memory cell including a diode and an antifuse in communication with the diode;
    wherein the antifuse includes a high-K dielectric material with a K greater than 3.9;
    wherein the programming pulse reverse biases the diode of the memory cell;
    and further comprising applying a first soaking pulse to the diode of the memory cell, and applying a second soaking pulse different from the first soaking pulse to a diode of another memory cell.

27. A method for programming memory, comprising:
applying a programming pulse to a memory cell including a diode and an antifuse in communication with the diode;
wherein the antifuse includes a high-K dielectric material with a K greater than 3.9;
wherein the programming pulse reverse biases the diode of the memory cell;
wherein programming pulses are applied to a plurality of memory cells simultaneously.

28. The method of claim 27, wherein the number of memory cells that are programmed over time is increased when the programming pulses are applied to the memory cells simultaneously.

29. A monolithic integrated circuit, comprising:
a monolithic three-dimensional array of memory cells including a plurality of word lines and a plurality of bit lines, the three-dimensional array of memory cells having more than one level of the word lines or more than one level of the bit lines;
wherein at least one of the memory cells includes:
a diode, and
an antifuse in communication with the diode and disposed vertically above or below the diode;
wherein the antifuse includes a high-K dielectric material with a K greater than 3.9;
wherein the at least one memory cell is programmed utilizing a programming pulse that reverse biases the diode thereof.

30. The integrated circuit of claim 29, wherein the diode includes a first portion including a first heavily doped material, a second portion including a second heavily doped material, and a third portion including an intrinsic or a lightly doped material.

31. The integrated circuit of claim 30, wherein the antifuse is in contact with the first portion of the diode.

32. The integrated circuit of claim 30, wherein the antifuse is in contact with the second portion of the diode.

33. The integrated circuit of claim 29, wherein the diode comprises a polycrystalline semiconductor material.

34. The integrated circuit of claim 29, wherein the more than one level of bit lines or more than one level of word lines are monolithically formed above a substrate in a monolithic three dimensional memory array.

* * * * *